US009082411B2

(12) United States Patent
Pedersen

(10) Patent No.: US 9,082,411 B2
(45) Date of Patent: Jul. 14, 2015

(54) METHOD TO REDUCE ARTIFACTS IN ALGORITHMS WITH FAST-VARYING GAIN

(75) Inventor: Michael Syskind Pedersen, Smørum (DK)

(73) Assignee: OTICON A/S, Smorum (DK)

( * ) Notice: Subject to any disclaimer, the term of this patent is extended or adjusted under 35 U.S.C. 154(b) by 776 days.

(21) Appl. No.: 13/313,790

(22) Filed: Dec. 7, 2011

(65) Prior Publication Data

US 2012/0148056 A1 Jun. 14, 2012

Related U.S. Application Data

(60) Provisional application No. 61/421,228, filed on Dec. 9, 2010.

(30) Foreign Application Priority Data

Dec. 9, 2010 (EP) .................................... 10194322

(51) Int. Cl.
*H03G 3/00* (2006.01)
*G10L 21/0208* (2013.01)
*G10L 21/057* (2013.01)

(52) U.S. Cl.
CPC ..... *G10L 21/0208* (2013.01); *G10L 2021/0575* (2013.01)

(58) Field of Classification Search
CPC ............ G10L 21/0208; G10L 21/0232; G10L 21/0205; G10L 25/27; H04R 2225/43; H04R 25/505; H03H 17/0216
USPC .................................................. 381/104, 107
See application file for complete search history.

(56) References Cited

U.S. PATENT DOCUMENTS 5,473,701 A 12/1995 Cezanne et al.
6,088,668 A 7/2000 Zack (Continued)

FOREIGN PATENT DOCUMENTS

EP 2 088 802 A1 8/2009
WO WO 99/09786 A1 2/1999
WO WO 2006/114101 A1 11/2006

OTHER PUBLICATIONS

Berouti et al., "Enhancement of speech corrupted by acoustic noise", Proc IEEE ICASSP, 4, 1979, pp. 208-211.

(Continued)

*Primary Examiner* — Duc Nguyen
*Assistant Examiner* — Kile Blair
(74) *Attorney, Agent, or Firm* — Birch, Stewart, Kolasch & Birch, LLP

(57) ABSTRACT

A method and device reduce artifacts in an audio processing algorithm for applying a time and frequency dependent gain to an input audio signal. The method provides a time frequency representation of an input audio signal comprising a number of frequency bands; applies an audio processing algorithm providing an estimated algorithm output signal; determines for each frequency band a difference between a value of the estimated gain signal at a given time and at a preceding time; averages the difference over a predefined time; provides a confidence estimate based on the time averaged difference, the said confidence estimate being relatively low in case said time averaged difference is above a predetermined threshold level and relatively high in case said time averaged difference is below a predetermined threshold level; and optionally applies the confidence estimate to the noise reduced output signal thereby providing an improved algorithm output signal.

21 Claims, 7 Drawing Sheets

(56) References Cited

U.S. PATENT DOCUMENTS

| | | | | |
|---|---|---|---|---|
| 6,351,731 | B1 | 2/2002 | Anderson et al. | |
| 7,016,507 | B1 | 3/2006 | Brennan | |
| 8,185,389 | B2 * | 5/2012 | Yu et al. | 704/233 |
| 2005/0278172 | A1 | 12/2005 | Koishida et al. | |
| 2008/0147387 | A1 | 6/2008 | Matsubara et al. | |
| 2009/0017784 | A1 | 1/2009 | Dickson et al. | |
| 2010/0014695 | A1 | 1/2010 | Breithaupt et al. | |
| 2010/0023327 | A1 | 1/2010 | Jung et al. | |

OTHER PUBLICATIONS

Ephraim et al., "Speech enhancement using a minimum-mean square error short-time spectral amplitude estimator", IEEE Transactions on Acoustics, Speech, and Signal Processing, vol. ASSP-32, No. 6, Dec. 1984, pp. 1109-1121.

Esch at al., "Efficient musical noise suppression for speech enhancement system", Acoustics, Speech and Signal Processing, 2009. ICASSP 2009. IEEE International Conference, Apr. 19, 2009, pp. 4409-4412.

Jan et al., "A multistage approach for blind separation of convolutive speech mixtures", Acoustics, Speech and Signal Processing, 2009. ICASSP 2009. IEEE International Conference, Apr. 19, 2009, pp. 1713-1716.

Linhard at al., "Noise reduction with spectral subtraction and median filtering for suppression of musical tones", Proc. of ESCA-NATO Workshop on Robust Speech Recognition for Unknown Communication Channels, 1997, pp. 159-162.

Olivier Cappé, "Elimination of the Musical Noise Phenomenon with the Ephraim and Malah Noise Suppressor", IEEE Trans. on Speech and Audio Proc., vol. 2, No. 2, Apr. 1994, pp. 345-349.

Uemura et al., "Musical Noise Generation Analysis for Noise Reduction Methods Based on Spectral Subtraction and MMSE STSA Estimation", Acoustics, Speech and Signal Processing, 2009. ICASSP 2009. IEEE International Conference, Apr. 19, 2009, pp. 4433-4436.

* cited by examiner

METHOD TO REDUCE ARTIFACTS IN ALGORITHMS WITH FAST-VARYING GAIN

CROSS REFERENCE TO RELATED APPLICATIONS

This nonprovisional application claims the benefit of U.S. Provisional Application No. 61/421,228 filed on Dec. 9, 2010 and to Patent Application No. 10194322.3 filed in Europe, on Dec. 9, 2010. The entire contents of all of the above applications is hereby incorporated by reference into the present application.

TECHNICAL FIELD

The present application relates to audio processing, for example to noise reduction algorithms. The disclosure relates specifically to a method of reducing artifacts in an audio processing algorithm for applying a time and frequency dependent gain to an input audio signal. The application furthermore relates to an audio processing device for applying a time dependent gain to an input audio signal and to the use of an audio processing device.

The application further relates to a data processing system comprising a processor and program code means for causing the processor to perform at least some of the steps of the method and to a computer readable medium storing the program code means.

The disclosure may e.g. be useful in applications such as audio processing systems, e.g. public address systems, listening devices, e.g. hearing instruments, etc.

BACKGROUND ART

Gains that fluctuate rapidly across time and frequency result in audible artifacts in digital audio processing systems.

U.S. Pat. No. 6,351,731 describes an adaptive filter featuring a speech spectrum estimator receiving as input an estimated spectral magnitude signal for a time frame of the input signal and generating an estimated speech spectral magnitude signal representing estimated spectral magnitude values for speech in a time frame. A spectral gain modifier receives as input an initial spectral gain signal and generates a modified gain signal by limiting a rate of change of the initial spectral gain signal with respect to the spectral gain over a number of previous time frames. The modified gain signal is then applied to the spectral signal, which is then converted to its time domain equivalent.

U.S. Pat. No. 6,088,668 describes a noise suppressor, which includes a signal to noise ratio (SNR) determiner, a channel gain determiner, a gain smoother and a multiplier. The SNR determiner determines the SNR per channel of the input signal. The channel gain determiner determines a channel gain per the $i^{th}$ channel. The gain smoother produces a smoothed gain per the $i^{th}$ channel and the multiplier multiplies each channel of the input signal by its associated smoothed gain.

U.S. Pat. No. 7,016,507 describes a noise reduction algorithm with the dual purpose of enhancing speech relative to noise and also providing a relatively clean signal for the compression circuitry. In an embodiment, a forgetting factor is introduced to slow abrupt gain changes in the attenuation function.

DISCLOSURE OF INVENTION

The amount of artifacts generated by an audio processing algorithm, e.g. a noise reduction algorithm, can be significantly decreased by detecting gains that fluctuate and selectively decrease the gain in these cases.

The term gain is in the present context broadly understood to include attenuation, i.e. gain factors on a non-logarithmic scale being larger than or equal to zero 0, and above as well as below 1 (attenuation), or gain factors in dB, including positive, zero, as well as negative values (attenuation).

FIG. 1 shows how such a detection device can be implemented. In each frequency sub-band, the gain difference is defined as the difference between the current gain and the previous gain. This difference is then smoothed over time. The smoothing can e.g. be implemented as an FIR filter or an IIR filter e.g. with different attack and release times (FIR=Finite Impulse Response, IIR=Infinite Impulse Response). The smoothed gain value is then converted into a number between 0 and 1, which is subsequently multiplied to the gain in dB. An example of such a conversion is illustrated in FIG. 2.

An object of the present application is to improve a user's perception of a sound signal, which has been subject to one or more audio processing algorithms.

Objects of the application are achieved by the invention described in the accompanying claims and as described in the following.

A Method of Identifying and Possibly Reducing Artifacts in an Audio Processing Algorithm:

An object of the application is achieved by a method of reducing artifacts in an audio processing algorithm for applying a time and frequency dependent gain to an input signal. The method comprises,

- Providing a time frequency representation i(k,m) of an input signal in a number of consecutive time frames, each time frame comprising a number of time-frequency units, each time-frequency unit comprising a complex or real value of the input signal, k, m being frequency and time indices respectively;
- Applying the audio processing algorithm to said time frequency representation of said input signal and providing an estimated algorithm output signal;
- Determining for at least one frequency of said input signal a difference between a value of the estimated algorithm output signal in a time-frequency unit of a given time frame and that of a preceding time frame;
- Determining a measure of the magnitude of said difference;
- Providing a time averaged value of the measure of the magnitude difference;
- Providing a confidence estimate based on said time averaged value of the measure of the magnitude difference, said confidence estimate decreasing from a maximum value towards a minimum value for increasing time averaged values of the measure of the magnitude difference.

An advantage of the present invention is that provides a tool to identify and possibly reduce artifacts in algorithms for processing an audio signal in a time-frequency representation.

The term 'artifact' is in the present context of audio processing taken to mean elements of an audio signal that are introduced by signal processing (digitalization, noise reduction, compression, etc.) that are in general not perceived as natural sound elements, when presented to a listener. The artifacts are often referred to as musical noise, which are due to random spectral peaks in the resulting signal. Such artifacts sound like short pure tones. Musical noise is e.g. described in [Berouti et al.; 1979], [Cappe; 1994] and [Linhard et al.; 1997].

The term 'the estimated algorithm output signal' is in the present context taken to mean the output of the audio processing algorithm without the artifact reduction measures proposed in the present disclosure. The term 'an improved algorithm output signal' is intended to mean the output of the audio processing algorithm having been subject to the artifact reduction measures proposed in the present disclosure. The 'improved algorithm output signal' contains fewer artifacts than the 'estimated algorithm output signal'.

Preferably, the estimated algorithm output signal is estimated in the same frequency units as the input signal (i.e. values of the estimated algorithm output signal are provided in the same frequency units $\Delta f_1$, $\Delta f_2$, $\Delta f_K$ as the input signal (or at least in some of them), cf. e.g. FIG. 3).

In general, the audio processing algorithm can be of any kind resulting in a relatively fast changing gain or attenuation, for example a noise reduction algorithm, a speech enhancement algorithm (cf. e.g. [Ephraim et al; 1984]), etc. The audio processing algorithm may be adapted to operate on an input signal originating from a single or from a multitude of input transducers.

In an embodiment, the method comprises the step of applying the confidence estimate to the estimated algorithm output signal thereby providing an improved algorithm output signal o(k,m). Alternatively or additionally the confidence estimate is used as an input to another algorithm or detector, e.g. to an algorithm for estimating reverberation.

The input signal can e.g. be an analogue or digital, time varying signal. The input signal can e.g. be represented by (time varying) signal values measured in absolute (e.g. Volt or Ampere) or relative terms (e.g. dB). The input signal can e.g. be a relative gain (e.g. measured in dB) or a normalized gain (or attenuation) attaining values between 0 and 1 (which may at a later stage be converted to a relative gain (or attenuation), e.g. measured in dB), e.g. a squared normalized gain (or a normalized gain raised to any other power than two).

In an embodiment, a difference between a value of the estimated algorithm output signal in a time-frequency unit of a given time frame and that of a preceding time frame is determined for at least 2 frequencies or frequency bands, such as for a majority of frequencies or frequency bands, such as for all frequencies or frequency bands of the input signal (and thus of the estimated algorithm output signal).

In an embodiment, the values of each frequency band of the estimated algorithm output signal that are compared (e.g. signal values or gain or attenuation values) are provided as actual values (e.g. sound pressure or voltage or current), or as normalized values (e.g. between 0 and 1), or as relative values (e.g. in dB). In an embodiment, the values of each frequency or frequency band of the estimated algorithm output signal that are compared are provided as normalized values, e.g. located between 0 and 1. In an embodiment, a normalized gain or attenuation is converted to a gain or attenuation measured in dB. In an embodiment, the difference or the averaged difference between a value of the estimated algorithm output signal in a time-frequency unit of a given time frame and that of a preceding time frame is provided as, such as is converted into, a number between 0 and 1.

In general, the effect of the audio processing algorithm is left unaltered, if the confidence estimate is high. Preferably, the effect of the audio processing algorithm is reduced (e.g. eliminated), if the confidence estimate is low.

In an embodiment, the improved algorithm output signal o(k,m) is expressed as the confidence estimate ce(k,m) times the estimated algorithm output signal eao(k,m), i.e. o(k,m)=ce(k,m)*eao(k,m). In an embodiment, the confidence estimate ce(k,m) is larger than or equal to 0, such as in the range from 0 to 1.

In an embodiment, the estimated algorithm output signal eao(k,m) is left unaltered, if the confidence estimate ce(k,m) attains its maximum value. In other words, the improved algorithm output signal o(k,m)=eao(k,m) (ce(k,m)=1). In an embodiment, the estimated algorithm output signal eao(k,m) is reduced (be it a gain or an attenuation, from its original value towards 0 dB), if the confidence estimate attains its minimum value. In other words, the improved algorithm output signal o(k,m)=ce(k,m)*eao(k,m), where ce(k,m)<1, e.g.=0.

In an embodiment, only magnitude values of the estimated algorithm output signal are considered.

In an embodiment, the measure of the magnitude difference of the estimated algorithm output signal is found as the absolute value of the difference.

In an embodiment, the measure of the magnitude difference of the estimated algorithm output signal is found as the squared absolute value of the difference. In this case, the confidence estimate corresponds to the variance of the estimated algorithm output signal.

In an embodiment, the measure of the magnitude difference (between a value of the estimated algorithm output signal in a time-frequency unit of a given time frame and that of a preceding time frame) is averaged over a predefined time. In an embodiment, the predefined time is related to a sampling frequency of an analogue to digital converter used to digitize the input signal. In an embodiment, the predefined averaging time corresponds to a predefined number of time frames, e.g. more than 5 time frames, e.g. more than 10 time frames, e.g. to a number of time frames from 5 to 15.

In an embodiment, the measure of the magnitude difference (between a value of the estimated algorithm output signal in a time-frequency unit of a given time frame and that of a preceding time frame) is averaged using an IIR low pass filter possibly with different attack and release times.

In an embodiment, the confidence estimate decreases monotonically with increasing time averaged magnitude difference.

In an embodiment, the confidence estimate has a first, high value PH (e.g. 1) when the time averaged measure of the magnitude difference is below a predetermined first threshold level Δ1. In an embodiment, the confidence estimate has a second, low value PL (e.g. 0) when the time averaged measure of the magnitude difference is above a predetermined second threshold level Δ2. In an embodiment, the confidence estimate is a confidence probability having values between 0 and 1.

In an embodiment, the confidence estimate decreases monotonically, e.g. linearly, from the first high value PH to the second low value PL, when the time averaged measure of the magnitude difference increases from the predetermined first threshold level Δ1 to the predetermined second threshold level Δ2. In an embodiment, the first and second threshold levels coincide (Δ1=Δ2).

In an embodiment, the preceding time frame is the immediately previous time frame. In an embodiment, the measure of the magnitude difference Δeao(k,m) between a value of the estimated algorithm output signal eao(k,m) in a time-frequency unit (k,m) of a given time frame (m) and that of a preceding time frame (m−1) is $\Delta eao(k,m)=|eao(k,m)-eao(k,m-1)|$. Alternatively, $\Delta eao(k,m)=|eao(k,m)-eao(k,m-1)|^2$ or some other measure representing the difference between to (possibly complex) values.

In an embodiment, a noise reduction algorithm based on a spatial separation of acoustic sources is used. In an embodiment, the noise reduction algorithm is based on time-frequency masking (based on a binary or non-binary time-frequency representation). In an embodiment, the method is used to detect reverberance in a given acoustical environment (e.g. in a room). Many spatial decisions assume point sources. In reverberant environments sound sources become diffuse, and diffuse sounds may for some algorithms that assume point sources result in input gain estimates that fluctuate rapidly across time. Detection of fluctuating gains will thus indicate that the listener is in a reverberant room. This can e.g. be achieved by analysing an average sum of the measure of the magnitude differences across time and frequency from an output of an audio processing algorithm. In case the average sum of the measure of the magnitude differences is above a predefined amount, a rapidly varying gain is identified and reverberance may be an option. This information may preferably be combined with other indicators of the current acoustic environment, e.g. one or more sensors. In an embodiment, the magnitude difference measure is combined with a level detection measure (both measures being above predefined levels being indicative of reverberation). In an embodiment, corresponding data from both hearing instruments of a binaural fitting are compared to identify reverberance. If the magnitude difference measures from the two hearing instruments are equal (or within a predefined difference of each other), reverberance may be an option.

An Audio Processing Device:

An audio processing device for applying a time and frequency dependent gain to an input signal is furthermore provided by the present application. The audio processing device comprises

- A T-TF-unit for providing a time frequency representation of an input signal, the time frequency representation comprising a number of consecutive time frames, each time frame comprising a number of time-frequency units, each time-frequency unit comprising a complex or real value of the input audio signal at a particular time and frequency;
- An audio processing unit for providing an estimated algorithm output signal based on said time frequency representation of said input signal;
- An artifact reduction unit for adapted to provide an improved algorithm output signal by
  - Determining for at least one frequency of said input signal a difference between a value of the estimated algorithm output signal in a time-frequency bin of a given time frame and that of a preceding time frame;
  - Determining a measure of the magnitude of said difference;
  - Averaging the measure of the magnitude difference over a predefined time;
  - Providing a confidence estimate based on said time averaged value of the measure of the magnitude difference, said confidence estimate decreasing from a maximum value towards a minimum value for increasing time averaged values of the measure of the magnitude difference.

It is intended that the process features of the method described above, in the detailed description of ‘mode(s) for carrying out the invention’ and in the claims can be combined with the device, when appropriately substituted by a corresponding structural feature and vice versa. Embodiments of the device have the same advantages as the corresponding method.

In an embodiment, the audio processing device comprises a combination unit for applying said confidence estimate to said estimated algorithm output signal thereby providing an improved estimated algorithm signal. Alternatively or additionally, the listening device may comprise a further processing unit adapted for using the confidence estimate in a further processing or evaluation of a signal of the device or of the acoustic environment of the device (e.g. reverberation).

Typically an audio processing device according to the present invention comprises a signal or forward path (for applying a frequency dependent gain to the input signal) and an analysis path (for analyzing the input signal and possibly determining or contributing to the determination of the gains to be applied in the signal path). The concepts and methods of the present invention may in general be used in a system, where the input signal is processed in the time domain in the signal path and analyzed in the frequency domain in the analysis path (cf. e.g. FIG. 6*a*). In an embodiment, the signal is processed in the frequency domain in the signal path as well as in the analysis path. The artifact reduction algorithm of the present invention will typically be used in an analysis path of the audio processing device (cf. e.g. FIG. 6).

In an embodiment, the audio processing device comprises a signal processing unit for enhancing the input signal and providing a processed output signal. In an embodiment, the signal processing unit is adapted to provide a frequency dependent gain to compensate for a hearing loss of a user. In an embodiment, the audio processing algorithm (e.g. a noise reduction algorithm) and the artifact reduction algorithm are executed by the signal processing unit.

In an embodiment, the audio processing device comprises a signal or forward path between an input transducer (microphone system and/or direct electric input (e.g. a wireless receiver)) and an output transducer. In an embodiment, the signal processing unit is adapted to provide a frequency dependent gain according to a user’s particular needs to the signal of the forward path.

In an embodiment, the audio processing device comprises a receiver unit for receiving a direct electric input. The receiver unit may be a wireless receiver unit comprising antenna, receiver and demodulation circuitry. Alternatively, the receiver unit may be adapted to receive a wired direct electric input. The direct electric input may comprise the input audio signal (in full or in part).

In an embodiment, the audio processing device comprises an output transducer for converting an electric signal to a stimulus perceived by the user as an acoustic signal. In an embodiment, the output transducer comprises a number of electrodes of a cochlear implant or a vibrator of a bone conducting hearing device. In an embodiment, the output transducer comprises a receiver (speaker) for providing the stimulus as an acoustic signal to the user.

In an embodiment, the audio processing device, e.g. a listening device or a communication device, comprises an AD-conversion unit for sampling an analogue electric input signal with a sampling frequency $f_s$ and providing as an output a digitized electric input signal (e.g. the input audio signal) comprising digital time samples $s_n$ of the input signal (amplitude) at consecutive points in time $t_n=n*(1/f_s)$, n is a sample index, e.g. an integer n=1, 2, . . . indicating a sample number. The duration in time of X samples is thus given by $X/f_s$.

In an embodiment, the consecutive samples $s_n$ are arranged in time frames $F_m$, each time frame comprising a predefined number Q of digital time samples $s_q$ (q=1, 2, . . . , Q), corresponding to a frame length in time of $L=Q/f_s$, where $f_s$ is a sampling frequency of an analog to digital conversion unit (each time sample comprising a digitized value $s_n$ (or s(n)) of the amplitude of the signal at a given sampling time $t_n$ (or n)). A frame can in principle be of any length in time. Typically consecutive frames are of equal length in time. In the present context, a time frame is typically of the order of ms, e.g. more than 3 ms (corresponding to 64 samples at $f_s$=20 kHz). In an embodiment, a time frame has a length in time of at least 8 ms, such as at least 24 ms, such as at least 50 ms, such as at least 80 ms. The sampling frequency can in general be any frequency appropriate for the application (considering e.g. power consumption and bandwidth). In an embodiment, the sampling frequency $f_s$ of an analog to digital conversion unit is larger than 1 kHz, such as larger than 4 kHz, such as larger than 8 kHz, such as larger than 16 kHz, e.g. 20 kHz, such as larger than 24 kHz, such as larger than 32 kHz. In an embodiment, the sampling frequency is in the range between 1 kHz and 64 kHz. In an embodiment, time frames of the input signal are processed to a time-frequency representation by transforming the time frames on a frame by frame basis to provide corresponding spectra of frequency samples (k=1, 2, . . . , K, e.g. by a Fourier transform algorithm), the time-frequency representation being constituted by TF-units (k,m) each comprising a complex value (magnitude and phase) of the input signal at a particular unit in time (m) and frequency (k), cf. e.g. FIG. 3. The frequency samples in a given time unit (m) may be arranged in bands $FB_j$ (j=1, 2, . . . , J), each band comprising one or more frequency units (frequency samples), cf. e.g. FIG. 3.

In an embodiment, the audio processing device comprises a directional microphone system adapted to separate two or more acoustic sources in the local environment of the user wearing the audio processing device. In an embodiment, the directional system is adapted to detect (such as adaptively detect) from which direction a particular part of the microphone signal originates. This can be achieved in various different ways as e.g. described in U.S. Pat. No. 5,473,701 or in WO 99/09786 A1 or in EP 2 088 802 A1.

In an embodiment, the audio processing device comprises a feedback path estimation unit. In an embodiment, the feedback path estimation unit comprises an adaptive filter. In a particular embodiment, the adaptive filter comprises a variable filter part and an adaptive algorithm part, the algorithm part e.g. comprising an LMS or an RLS algorithm, for updating filter coefficients of the variable filter part. Various aspects of adaptive filters are e.g. described in [Haykin].

In a particular embodiment, the audio processing device comprises a voice detector (VD) for determining whether or not the input audio signal comprises a voice signal (at a given point in time). A voice signal is in the present context taken to include a speech signal from a human being. It may also include other forms of utterances generated by the human speech system (e.g. singing). In an embodiment, the voice detector is adapted to classify a current acoustic environment of the user as a VOICE or NO-VOICE environment. This has the advantage that time segments of the input audio signal comprising human utterances (e.g. speech) in the user's environment can be identified, and thus separated from time segments only comprising other sound sources (e.g. artificially generated noise). In an embodiment, the voice detector is adapted to apply the artifact reduction algorithm when a VOICE is detected (and to disable the artifact reduction algorithm, when NO-VOICE is detected, e.g. to save power). Such voice and/or own voice detectors can e.g. further be used as sensors to complement an identification of room reverberance as described above.

The audio processing device comprise(s) a TF-conversion unit (cf. e.g. T→TF-unit in FIG. 6) for providing a time-frequency representation of an input signal. In an embodiment, the time-frequency representation comprises an array or map of corresponding complex or real values of the signal in question in a particular time and frequency range. In an embodiment, the TF conversion unit comprises a filter bank for filtering a (time varying) input signal and providing a number of (time varying) output signals each comprising a distinct frequency range of the input signal. In an embodiment, the TF-conversion unit provides the time frequency representation of the input audio signal. In an embodiment, the TF conversion unit comprises a Fourier transformation unit for converting a time variant input signal to a (time variant) signal in the frequency domain. In an embodiment, the frequency range considered by the audio processing device extends from a minimum frequency $f_{min}$ to a maximum frequency $f_{max}$ and comprises a part of the typical human audible frequency range from 20 Hz to 20 kHz, e.g. a part of the range from 20 Hz to 12 kHz. In an embodiment, the frequency range $f_{min}$–$f_{max}$ considered by the audio processing device is split into a number P of frequency bands, where P is e.g. larger than 2, such as larger than 5, such as larger than 10, such as larger than 50, such as larger than 100, at least some of which are processed (and/or analyzed) individually, in at least some of the processing steps. The frequency bands may be uniform or non-uniform in width (e.g. increasing in width with frequency), cf. e.g. FIG. 3.

In an embodiment, the audio processing device comprises a level detector for determining or estimating a magnitude level of an input signal. In an embodiment, the audio processing device comprises a level decision unit. The level decision unit comprises e.g. a level detector for estimating the level of the input signal and a decision unit for translating the input level estimate to an input level weighting factor. In an embodiment, the output of the level decision unit is fed to the artifact reduction unit. The purpose of the level decision unit is to reduce the weight in the artifact reduction unit of time-frequency units in the input signal having a relatively low level (where possible fluctuations might be due to noise).

In an embodiment, the audio processing device further comprises other relevant functionality for the application in question, e.g. audio compression, etc.

In an embodiment, the audio processing device is adapted to provide that the artifact reduction scheme is applied to more than one audio processing algorithm at a given time, so that e.g. outputs of a noise reduction algorithm and another algorithm are simultaneously (or sequentially) subject to the scheme to reduce the total number of artifacts introduced by said more than one audio processing algorithm.

In an embodiment, the audio processing device comprises a public address system, a teleconference system, an entertainment system, a communication device, or a listening device, e.g. a hearing aid, e.g. a hearing instrument or a headset. In an embodiment, the audio processing device comprises a portable device.

Use of an Audio Processing Device:

Use of an audio processing device or an audio processing system as described above, in the detailed description of 'mode(s) for carrying out the invention', or in the claims, is moreover provided by the present application. In an embodiment, use in a public address system, a teleconference system, an entertainment system, a communication device, or a listening device, e.g. a hearing aid, e.g. a hearing instrument or a headset is provided. In an embodiment, use in a binaural hearing aid system is provided. This has the advantage that gain fluctuation data from independent audio processing algorithms can be compared and e.g. used to indicate properties of the acoustic environment and/or the received audio signal (e.g. properties related to reverberation). In an embodiment, use for estimating reverberation, e.g. in a reverberation detector is provided.

An Audio Processing System:

In an aspect, an audio processing system comprising first and second audio processing devices as described above, in the detailed description of 'mode(s) for carrying out the invention' and in the claims is provided. The first and second audio processing devices generate first and second confidence estimates (e.g. probabilities), respectively. In an embodiment, each audio processing device comprises a (e.g. wireless) transceiver for establishing a bidirectional link to the other device and is adapted to transmit a confidence estimate (or a measure originating there from) to the other audio processing device. In an embodiment, each audio processing device is adapted to compare the first and second confidence estimates (or measures originating there from) and to generate a resulting confidence estimate (or a measure originating there from, e.g. a reverberation estimate, e.g. a probability) that is applied to the respective estimated algorithm output signals (e.g. to noise reduced output signals). In an embodiment, an average (e.g. a weighted average) of the first and second confidence probabilities (or measures originating there from) is generated and used to apply to the respective estimated algorithm output signals (e.g. to noise reduced output signals). In an embodiment, each audio processing device comprises a wireless transceiver for establishing a bidirectional link to the other device and is adapted to transmit a partial or a full audio signal (e.g. in addition to control signals, including a confidence estimate of an audio processing algorithm) to the other audio processing device. In an embodiment, first and second audio processing devices each comprise a hearing instrument, the audio processing system thereby comprising a binaural hearing aid system comprising first and second hearing instruments adapted for being worn by a user at or in the respective ears of the user.

A Computer Readable Medium:

A tangible computer-readable medium storing a computer program comprising program code means for causing a data processing system to perform at least some (such as a majority or all) of the steps of the method described above, in the detailed description of 'mode(s) for carrying out the invention' and in the claims, when said computer program is executed on the data processing system is furthermore provided by the present application. In addition to being stored on a tangible medium such as diskettes, CD-ROM-, DVD-, or hard disk media, or any other machine readable medium, the computer program can also be transmitted via a transmission medium such as a wired or wireless link or a network, e.g. the Internet, and loaded into a data processing system for being executed at a location different from that of the tangible medium.

A Data Processing System:

A data processing system comprising a processor and program code means for causing the processor to perform at least some (such as a majority or all) of the steps of the method described above, in the detailed description of 'mode(s) for carrying out the invention' and in the claims is furthermore provided by the present application.

Further objects of the application are achieved by the embodiments defined in the dependent claims and in the detailed description of the invention.

As used herein, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element or intervening elements may be present, unless expressly stated otherwise. Furthermore, "connected" or "coupled" as used herein may include wirelessly connected or coupled. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF DRAWINGS

The disclosure will be explained more fully below in connection with a preferred embodiment and with reference to the drawings in which.

The figures are schematic and simplified for clarity, and they just show details which are essential to the understanding of the disclosure, while other details are left out.

Further scope of applicability of the present disclosure will become apparent from the detailed description given hereinafter. However, it should be understood that the detailed description and specific examples, while indicating preferred embodiments of the disclosure, are given by way of illustration only. Other embodiments may become apparent to those skilled in the art from the following detailed description.

MODE(S) FOR CARRYING OUT THE INVENTION

The method and system are illustrated by FIG. 1-8.

Figure 1:
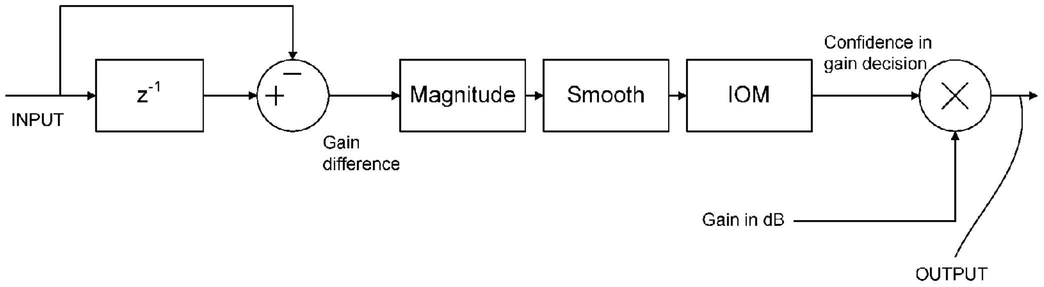
FIG. 1 shows an embodiment of an artifact reduction unit for detecting input gains that fluctuate, and for decreasing the gain in these cases thereby providing an improved signal.

FIG. 1 shows an embodiment of an artifact reduction unit for detecting input gains that fluctuate, and for decreasing the gain in these cases thereby providing an improved signal.

The INPUT signal is e.g. represented by a number greater than or equal to 0 representing a signal magnitude for a given time and frequency (e.g. by a number between 0 and 1 or equal to 0 or 1). In order to detect rapid gain changes, the change in gain from one time frame to the next time frame is found (cf. delay unit '$z^{-1}$' and subtraction unit '+−', providing the Gain difference in FIG. 1). The magnitude of the signal is determined and smoothed (averaged) (cf. Magnitude and Smooth units, respectively, in FIG. 1). The magnitude unit (Magnitude) can e.g. be implemented as 'abs' or 'abs$^2$' units (indicating units for calculating the 'abs'-value and the 'abs'-value squared, respectively). The smoothing unit (Smooth) can e.g. be implemented by a first order IIR filter (or FIR filter), possibly with different attack and release times. The smoothed value is (here) transformed into a slowly varying average value between 0 and 1 (a value indicating how confident we can be in the gain decision, cf. 'IOM' unit in FIG. 1), which is multiplied to the time-varying gain (cf. multiplication unit 'x' in FIG. 1, where the Confidence in gain decision signal is multiplied by the otherwise intended gain, Gain in dB, to provide the OUTPUT signal in the form of an Improved gain value for the frequency in question). The time-varying gain denoted, Gain in dB in FIG. 1, is e.g. the output from an audio processing algorithm, e.g. equal to the INPUT signal, possibly apart from a logarithmic transformation providing the INPUT signal as Gain in dB.

Figure 2:
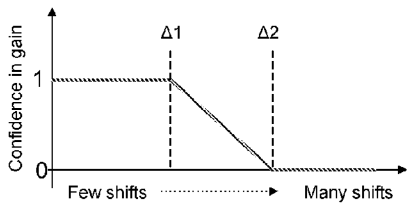
FIG. 2 shows an example of a gain reduction strategy for minimizing artifacts.

A possible scheme for mapping the number of shifts (e.g. represented by a magnitude difference of the signal between two time instances, averaged over a predefined time) to a confidence level (i.e. performed by the IOM unit in FIG. 1) is shown in FIG. 2. If the (average) amount of gain-change from one time frame to the next time frame is small (≤Δ1, denoted Few shifts in FIG. 2), no (or few) artifacts are introduced to the signal and the gain (or attenuation) provided by the processing algorithm (in the time-frequency unit in question) should not be reduced. If, however, the (average) amount of gain-change is higher (≥Δ1, denoted→Many shifts in FIG. 2), the probability of audible artifacts is higher and the output gain (or attenuation) should be reduced (=>less effect of the processing algorithm in question). In the exemplary scheme of FIG. 2, a linear reduction of the confidence level (Confidence in gain in FIG. 2) from 1 to 0 in the range from Δ1 to Δ2 is shown. The shape of the curve may alternatively, depending on the application, be non-linear, e.g. exponential, e.g. a sigmoid shape (e.g. tan h). In an embodiment, the confidence level decreases monotonically from a maximum value towards a minimum value for increasing 'average number of shifts' (or increasing 'time averaged magnitude difference'). Beyond a border level Δ2 (defining the minimum value of Many shifts, in FIG. 2), the confidence level is set to 0. This may e.g. result in a reduced value being assigned to the signal output of the audio processing algorithm (for the time-frequency unit in question). Ultimately a value neglecting the effect of the processing algorithm may be assigned to the signal output of the audio processing algorithm. In an embodiment, where the audio processing algorithm provides a binary output gain, a single border level Δ0 discriminating between 'few' and 'many' shifts is in the range from 1 to 10 out of 50 time frames. In an embodiment, a running number of shifts $\langle n_{shift}(N_{prd})\rangle$ (e.g. of a binary representation of the signal) over a predefined number $N_{prd}$ of the most recent time frames is determined, e.g. over the last 10 or 50 or 100 time frames. In an embodiment, a running average of the magnitude difference $\langle md(N_{prd})\rangle$ of the output signal of an audio processing algorithm (e.g. of a non-binary representation of the signal) over a predefined number $N_{prd}$ of the most recent time frames is determined, e.g. over the last 10 or 50 or 100 time frames. Relating to FIG. 2, exemplary values of Δ1 and Δ2 are selected to be 0.05 to 0.2 and 0.1 to 0.3, respectively, for a normalized (binary or non-binary) representation of the signal. In general, 'few' and 'many' shifts (or the corresponding thresholds) are defined relative to the averaging time. In an embodiment, the input signal (of a given time-frequency unit) is taken to contain 'few' shifts if the time averaged magnitude difference is smaller than or equal to 0.05 (or 0.1) (for normalized gain values mapped on the interval between 0 and 1). In an embodiment, correspondingly, the input signal (of a given time-frequency unit) is taken to contain 'many' shifts if the time averaged magnitude difference is larger than or equal to 0.1 (or 0.2). In an embodiment, the time averaged magnitude difference is averaged over all previous samples (e.g. implemented by an IIR-filer). In an embodiment, the time averaged magnitude difference is averaged over a predefined number of previous samples (e.g. implemented by a FIR filter).

The input to the IOM unit is the smoothed estimate of the number of gain shifts per frame (time averaged magnitude difference) and the output is the value we multiply onto the (otherwise) intended gain (or attenuation). When the average number of shifts or the average magnitude difference is low, the gain (or attenuation) is not reduced, but when the gain (or attenuation) fluctuates considerably, the gain (or attenuation) is reduced in order to reduce the number of artifacts. In an embodiment, the gain (or attenuation) is reduced (towards 0 dB) by a predefined amount when the number of shifts or the average magnitude difference is larger than a predefined number (e.g. Δ2 in FIG. 2 corresponding to Many shifts and a Confidence in gain of 0). In an embodiment, the gain (or attenuation) is reduced to 0 dB when the number of shifts (or the time averaged magnitude difference) is larger than a predefined number.

Figure 3:
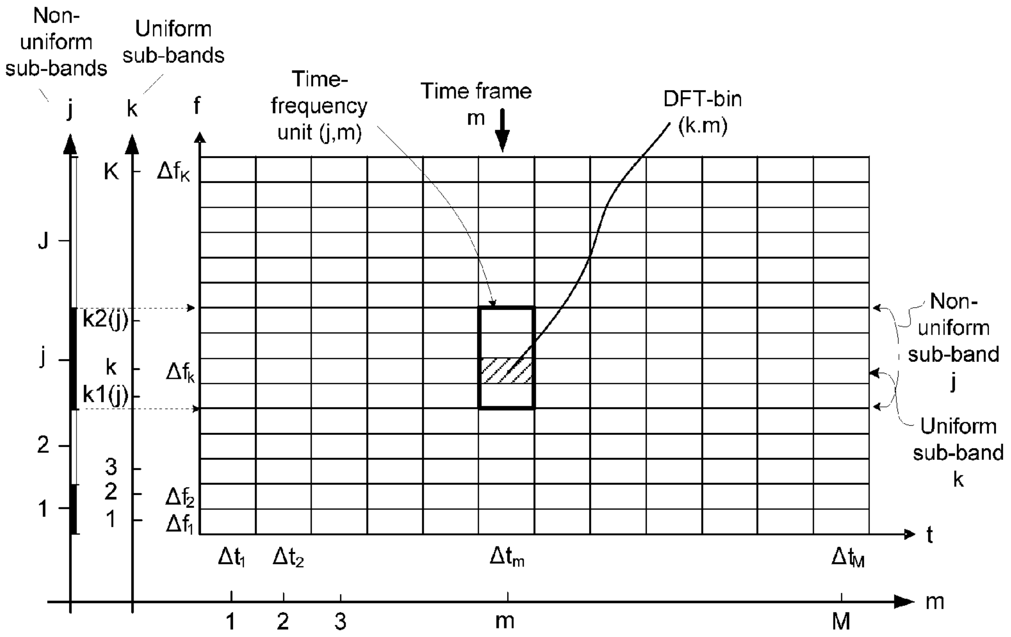
FIG. 3 is a schematic illustration of a time-frequency mapping of a signal, showing uniform and non-uniform frequency bands.

A time-frequency mapping of an input audio signal is schematically illustrated in FIG. 3. A time varying input signal s(n) is shown in a time-frequency representation s(k,m) comprising values of magnitude and possibly phase of the signal in a number of bins, e.g. DFT-bins (DFT=Discrete Fourier Transform, other transforms may be used, though) or, alternatively termed, time-frequency units, defined by indices (k,m), where k=1, . . . , K represents a number K of frequency values and m=1, . . . , M represents a number M of time frames, a time frame being defined by a specific time index m and the corresponding K DFT-bins. This corresponds to a uni-form frequency band representation, each band comprising a single value of the signal corresponding to a specific frequency and time, and the frequency units are equidistant (uni-form). This is illustrated in FIG. 3 and may e.g. be the result of a discrete Fourier transform of a digitized signal arranged in time frames, each time frame comprising a number of digital time samples $s_q$ of the input signal (amplitude) at consecutive points in time $t_q=q^*(1/f_s)$, q is a sample index, e.g. an integer q=1, 2, . . . indicating a sample number, and $f_s$ is a sampling rate of an analogue to digital converter. In an embodiment, the sampling rate is in the range from 10 kHz to 40 kHz, e.g. larger than 15 kHz or larger than 20 kHz.

Figure 4:
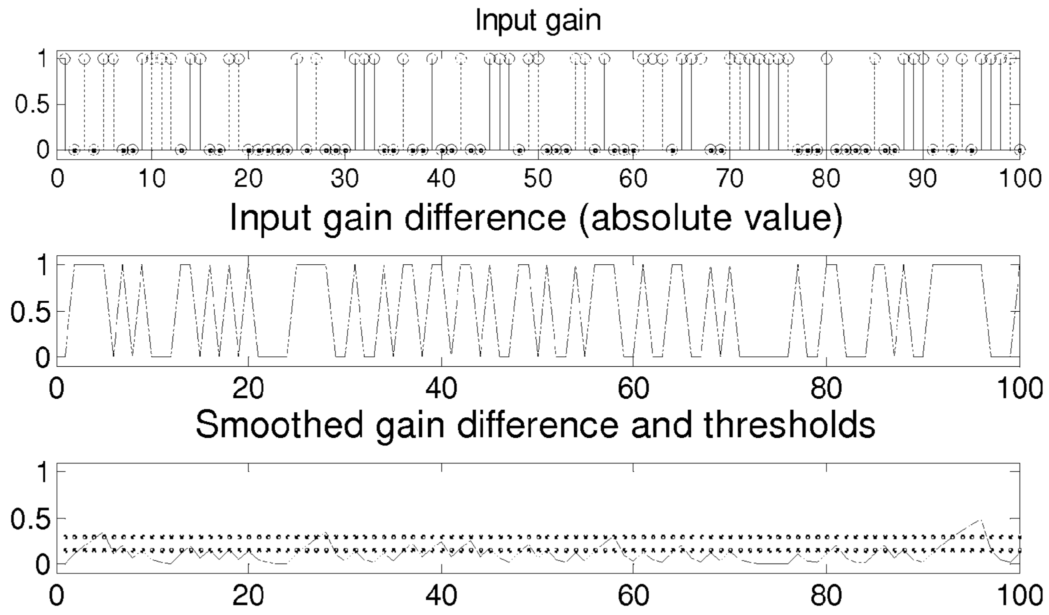
FIG. 4 shows an example of how the shift detection works with a binary gain as input.
Figure 5:
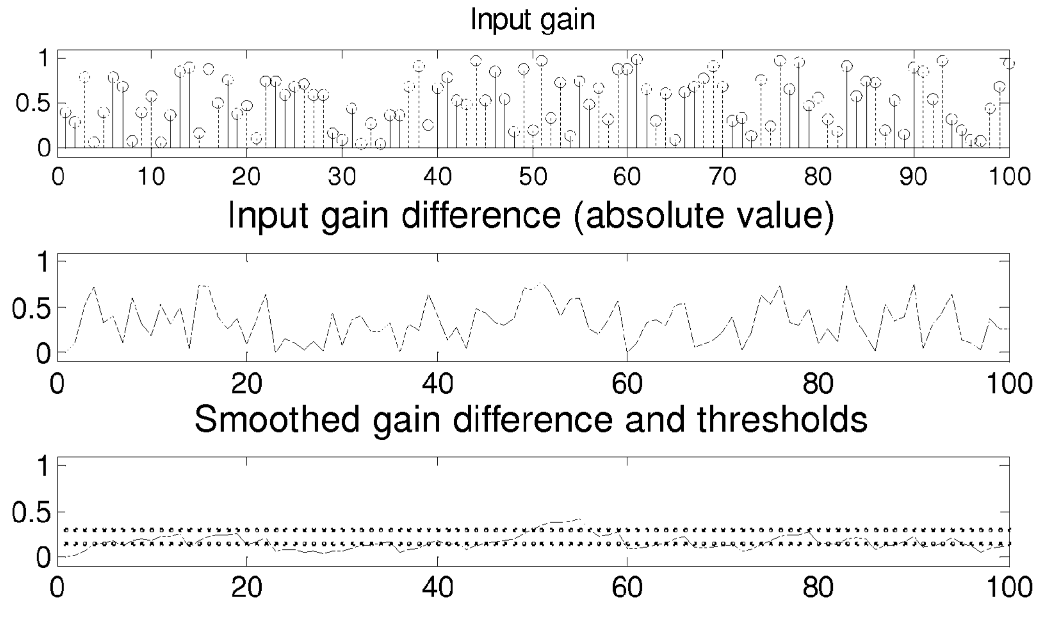
FIG. 5 shows an example of how the shift detection works with a continuous gain as input.

FIG. 4 and FIG. 5 show examples of how the shift detection works with a binary gain and a continuous gain as input (cf. INPUT signal in FIG. 1), respectively.

FIG. 4 shows an example of an audio processing algorithm providing a binary gain (e.g. attenuation). The upper part shows the input gain versus time (time frame number). The plot in the middle shows the corresponding input gain difference. Whenever the input gain (G) fluctuates, the magnitude of the gain difference (|ΔG|) is one; otherwise zero (i.e. if |G(m)−G(m−1)|≠0, β ΔG|=1; otherwise |ΔG|=0). The plot in the bottom shows the corresponding smoothed (averaged) difference vs. time. The two dotted horizontal lines indicate thresholds, determining two knee points in the input-output—mapping (cf. e.g. Δ1, Δ2 in FIG. 2). If the smoothed difference is higher than Δ1, the attenuation is decreased (towards 0 dB) in order to reduce artifacts that are introduced by gain fluctuations. In an embodiment, the smoothed gain difference (bottom curve) is provided by filtering the gain difference (middle curve), e.g. with a first order IIR filter.

FIG. 5 is similar to FIG. 4, but with a continuous gain between 0 and 1 instead of a binary gain. Alternatively, the INPUT gain values could be absolute values larger than or equal to 0 or they could be relative values in dB.

An advantage of the concept is that it is a powerful tool to reduce artifacts in audio processing algorithms, in particular in TF-masking algorithms.

Embodiments of an audio processing device, e.g. a listening device, e.g. a hearing instrument, comprising an artifact reduction (AR) unit, a signal processing algorithm SP (e.g. a noise reduction algorithm (NR)) and a unit for further enhancing the signal RG, e.g. by applying a frequency dependent gain (HA-G), is shown in FIG. 6.

Figure 6A:
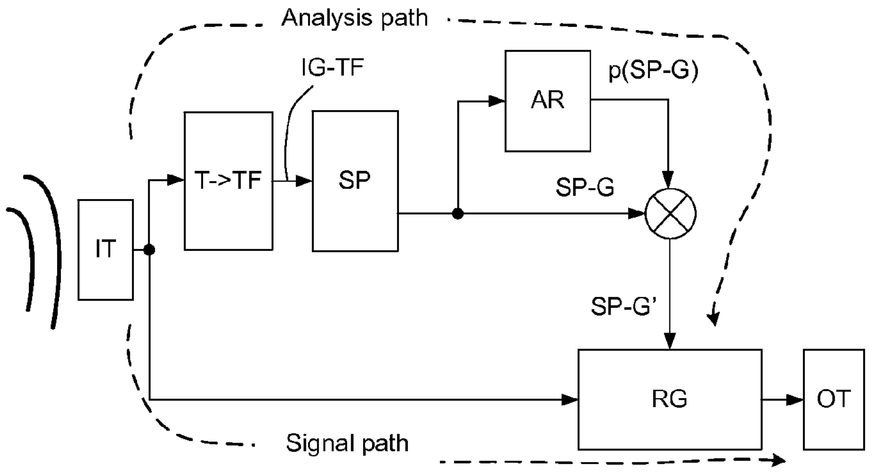
FIG. 6 shows various embodiments of an audio processing device according to an embodiment of the present disclosure.

FIG. 6*a* shows an audio processing device according to an embodiment of the present invention. The audio processing device comprises an input transducer unit IT (e.g. comprising a microphone or a microphone system and/or a wireless receiver, cf. FIG. 6*f*) for providing an electric input (audio) signal (e.g. by converting an input sound to an electric signal, e.g. a digital signal) or receiving such signal (e.g. by wire or wirelessly) from another device). The audio processing device further comprises an output transducer unit OT (e.g. comprising a speaker) for converting an (processed) electric signal to an output sound (or to a signal that is perceived by a person as a sound signal). A signal path (cf. dashed arrow denoted Signal path in FIG. 6*a*) between the input transducer and the output transducer comprises a processing unit RG for enhancing the signal before it is being presented to the user, e.g. by applying a resulting gain to the signal. An analysis path (cf. dashed arrow denoted Analysis path in FIG. 6*a*) between the input transducer and the processing unit RG comprises a time to time-frequency transformation unit T→TF for providing the electric input signal in a frequency band representation in a number of consecutive time frames IG-TF. The frequency band representation of the input audio signal is processed by a processing algorithm (e.g. a noise reduction algorithm) in signal processor SP which processes the input signal IG-TF and provides a processed output signal SP-G (e.g. in a normalized form, e.g. with values between 0 and 1). An artifact reduction algorithm in signal processor AR analyses the frequency band representation of the processed output signal SP-G from the signal processor SP and provides as an output a signal p(SP-G) indicative of the fluctuation (change from one value to another) of signal values across time of the frequency bands of the processed output signal, the output signal p(SP-G) e.g. representing a probability of fluctuation, e.g. averaged over a certain number of time units. The audio processing system further comprises a combining unit (here multiplying unit ‘x’) wherein the output signal SP-G of the processing algorithm is combined (here multiplied) with the signal p(SP-G) indicative of the tendency of change of the output signal SP-G (in a given time and frequency unit) and providing as an output a modified signal SP-G', which is used to control or influence the output signal from processing unit RG (e.g. to determine a resulting gain (e.g. in dB), e.g. by setting filter coefficients of a variable filter or adding or subtracting a gain to/from an otherwise determined or requested gain). The output of processing unit RG is here fed to output transducer OT for being presented to a user, but may alternatively be subject to further processing in appropriate processing units (and/or transmitted to another unit by wire or wirelessly).

In the embodiment of FIG. 6*a*, the signal path (including processing unit RG) processes the input audio signal in the time domain, whereas the analysis and control of the resulting gain of the signal path is determined in the frequency domain.

Figure 6B:
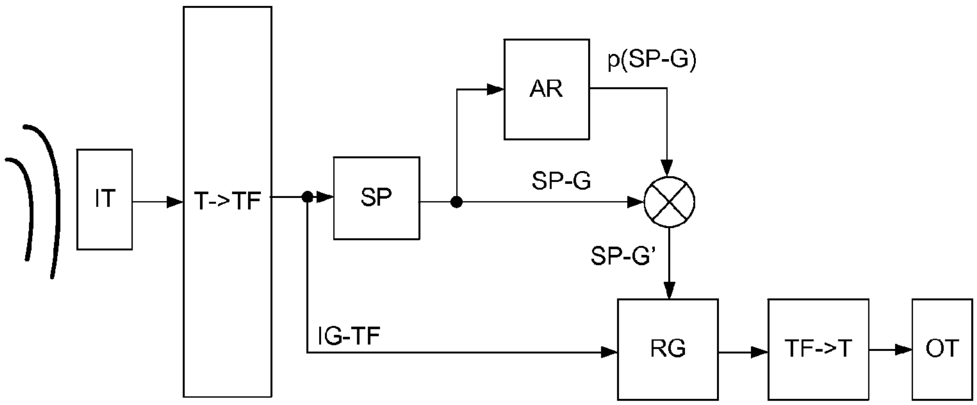

In general, the embodiments of an audio processing system shown in FIGS. 6*b*, 6*c*, 6*d*, 6*e* and 6*f* comprise the same elements as the embodiment shown in FIG. 6*a* and described above. However, the analysis path as well the signal path analyses and processes, respectively, the input audio signal in the frequency domain. Hence, the output (IG-TF) of the time-frequency transformation unit T→TF is connected to the processing unit RG as well. Consequently, the signal path further comprises a time-frequency to time conversion unit TF→T for converting a processed signal from a frequency band representation to a time domain representation before it is being presented to a user via the output transducer OT. The mentioned differences are illustrated in the embodiment of FIG. 6*b* (as the only difference to the embodiment of FIG. 6*a*).

Figure 6C:
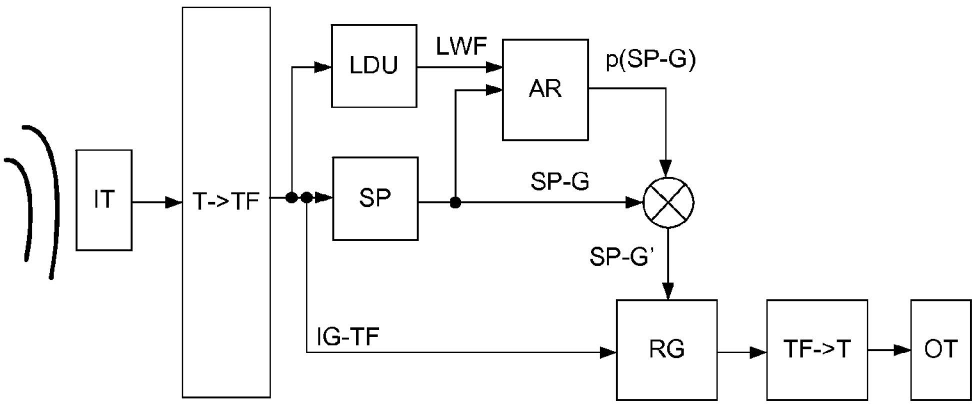

The embodiment of an audio processing system shown in FIG. 6*c* differs from the embodiment of FIG. 6*b* in that the output (IG-TF) of the time-frequency transformation unit T→TF is additionally connected to a level decision unit LDU. The level decision unit LDU comprises a level detector for estimating the level of the input signal (IG-TF) a decision unit for translating the input level estimate to an input level weighting factor LWF, forming the output of the level decision unit LDU and fed to the artifact reduction unit AR. The purpose of the level decision unit LDU is to reduce the weight in the artifact reduction unit AR of time-frequency units in the input signal IG-TF having a relatively low level (where possible fluctuations might be due to noise), cf. also discussion of the level decision unit LDU in connection with FIG. 8, where its purpose and function is the equivalent.

Figure 6D:
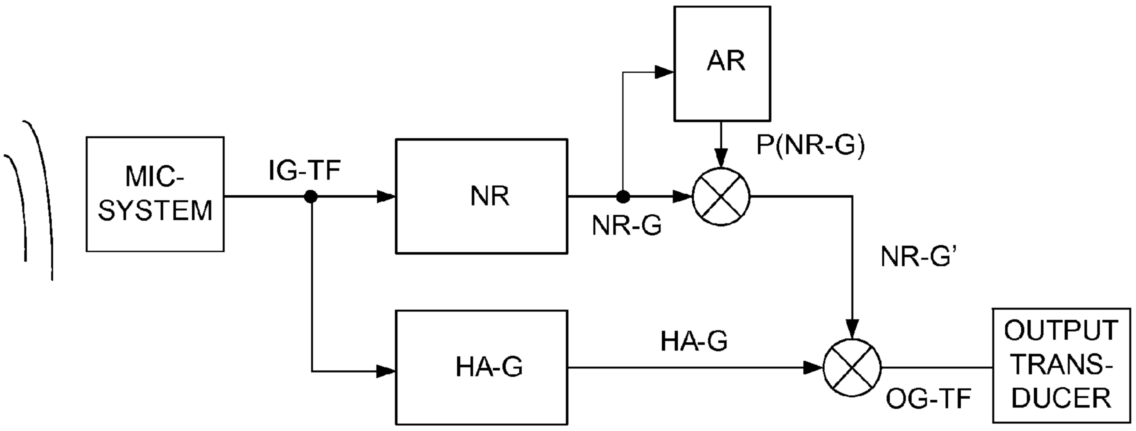

The embodiment of an audio processing system shown in FIG. 6*d* differs from the embodiment of FIG. 6*b* in that the input transducer is a microphone system MIC-SYSTEM providing as an output a (possibly directional) signal IG-TF in a time-frequency representation, the microphone system comprising analogue to digital (A/D) and time to time-frequency conversion (T→TF) units. The processing algorithm in the analysis path is assumed to be a noise reduction algorithm (cf. processing unit NR and output signal NR-G providing signal gain values after the noise reduction algorithm has been applied to the input signal IG-TF. Further, the output signal from the signal processor AR indicative of the fluctuation of the output signal NR-G is indicated by p(NR-G)). It is further anticipated that the audio processing device is a hearing aid (cf. signal processing unit in the signal path denoted HA-G providing a requested hearing aid gain output signal HA-G. The requested hearing aid output signal HA-G (e.g. providing a frequency dependent gain according to a user’s hearing impairment, e.g. excl. noise reduction) is combined with the improved noise reduction signal NR-G' in combiner unit ‘x’ (providing a time and frequency dependent gain-reduction (attenuation)) to provide an improved hearing aid gain OG-TF in a time-frequency representation. The improved signal OG-TF from the combiner unit ‘x’ is here adapted for being presented to a user via the OUTPUT TRANSDUCER unit (comprising in addition to the output transducer function, time-frequency to time (TF→T) and possibly digital to analogue (D/A) conversion functionality). If, for example, the noise reduction algorithm (in a given time-frequency unit) proposes a maximum attenuation of 10 dB (corresponding to signal NR-G) and the artifact reduction algorithm provides a fluctuation probability of 0.5 (for that time-frequency unit), a resulting gain of −5 dB is provided (for that time-frequency unit). Such resulting gain (in dB) is e.g. intended to be combined with a requested gain according to a person’s hearing impairment. In this case a resulting gain that is 5 dB lower than the requested gain (of HA-G) is provided, where the noise reduction algorithm, taken alone, without artifact reduction, would have provided a resulting gain that were 10 dB lower than the requested gain (for that time-frequency unit)). If as the example indicates, the improved algorithm output signal is a value in dB (in a given time-frequency unit) intended to be added to or subtracted from the requested hearing aid gain output signal HA-G., the combiner unit 'x' providing as an output the improved hearing aid gain OG-TF should be an adding unit (+).

Figure 6E:
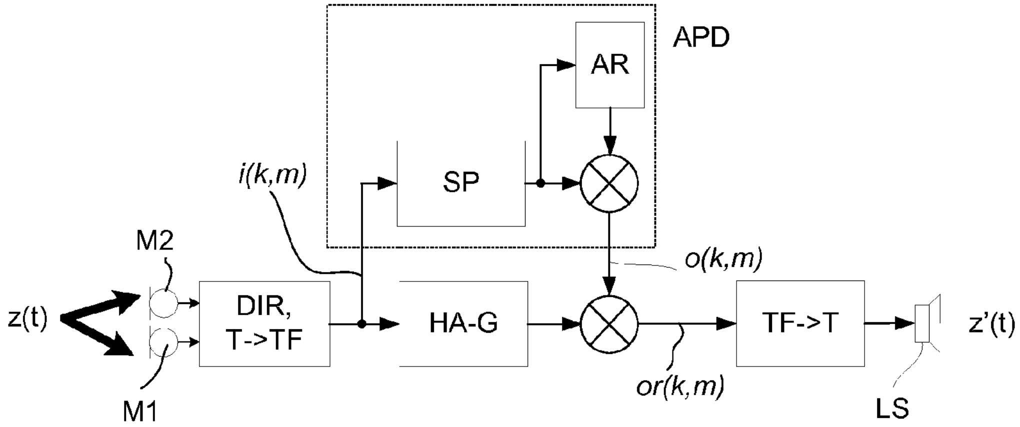

The embodiment of an audio processing device (e.g. a hearing aid) shown in FIG. 6*e* is identical to that of FIG. 6*d* apart from the microphone system MIC-SYSTEM of FIG. 6*d* being exemplified in FIG. 6*e* by two microphone units M1, M2 for picking up a time variant acoustic input sound signal z(t) and converting it to respective (digital) electric input signals, which are converted to a time-frequency representation and probably subject to directional extraction in the DIR, T→TF unit, which provides the input signal i(k,m) in a time-frequency representation, where k and m are frequency and time indices, respectively. A minimum configuration of an audio processing device according to the present disclosure is embodied by the artifact reduction unit AR and the signal processing unit SP and the combination unit 'x' (e.g. a multiplier or an adder unit, depending on the application in question) as indicated by the dotted enclosure denoted APD, whose input signal is i(k,m) and whose output signal is o(k, m). The output signal o(k,m) representing an improved processing gain (e.g. after noise reduction) is e.g. multiplied on (or added to) a requested gain (e.g. according to a user's hearing impairment) from the signal processing unit HA-G of the signal path to provide an improved hearing aid gain or(k, m). The output transducer unit OUTPUT TRANSDUCER of FIG. 6*d* is exemplified in FIG. 6*e* as a time-frequency to time unit TF→T and a speaker LS providing an improved time variant output sound signal zit).

Figure 6F:
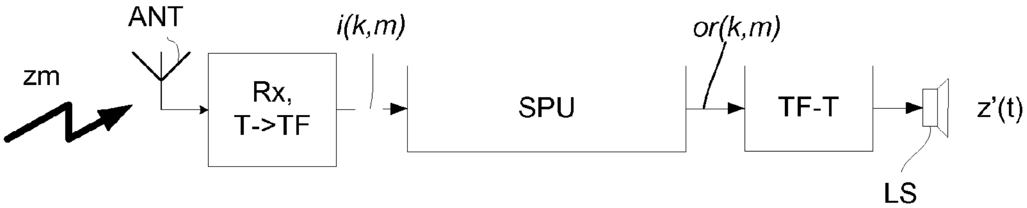

The embodiment of an audio processing device in FIG. 6*f* is equivalent to the embodiment of FIG. 6*e*, apart from the input transducer—instead of (or as a selectable alternative to) a microphone (or a microphone system)—being a wireless receiver comprising antenna ANT and transceiver circuitry Rx for receiving (and possibly demodulating) a wirelessly transmitted input audio signal zm. The output signal from the wireless receiver and time to time-frequency unit Rx, T-TF is the input audio signal in time-frequency representation i(k, m). The signal processing unit SPU represents the APD, HA-G and 'x' blocks and their interconnections of the embodiment of FIG. 6*e* and its output signal or(k,m) represents the improved signal ready for being presented to a user (after proper conversion) by speaker LS or for being further processed (e.g. including being transmitted to another device via a wired or wireless transceiver unit). The input audio signal zm may alternatively be received by a wired interface, e.g. a DAI-interface.

Example

Figure 7A:
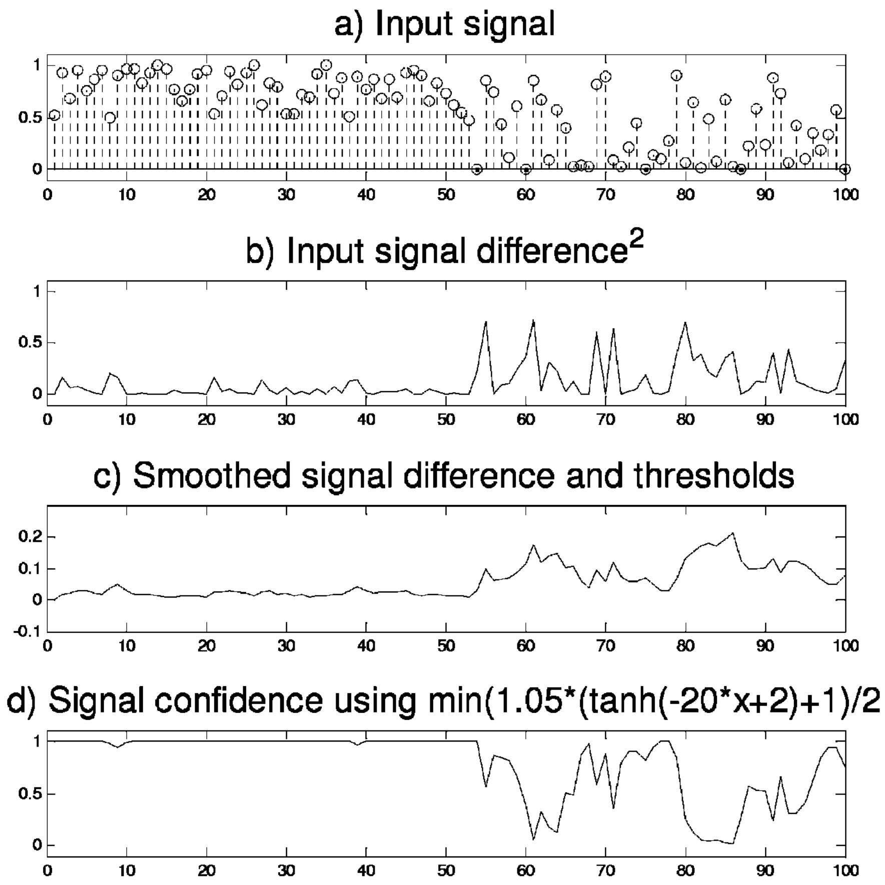
FIG. 7 shows an example of a use of the artifact reduction method of the present disclosure, graphs (a)-(h) being distributed over two pages denoted FIG. 7*a* and FIG. 7*b*, respectively.
Figure 7B:
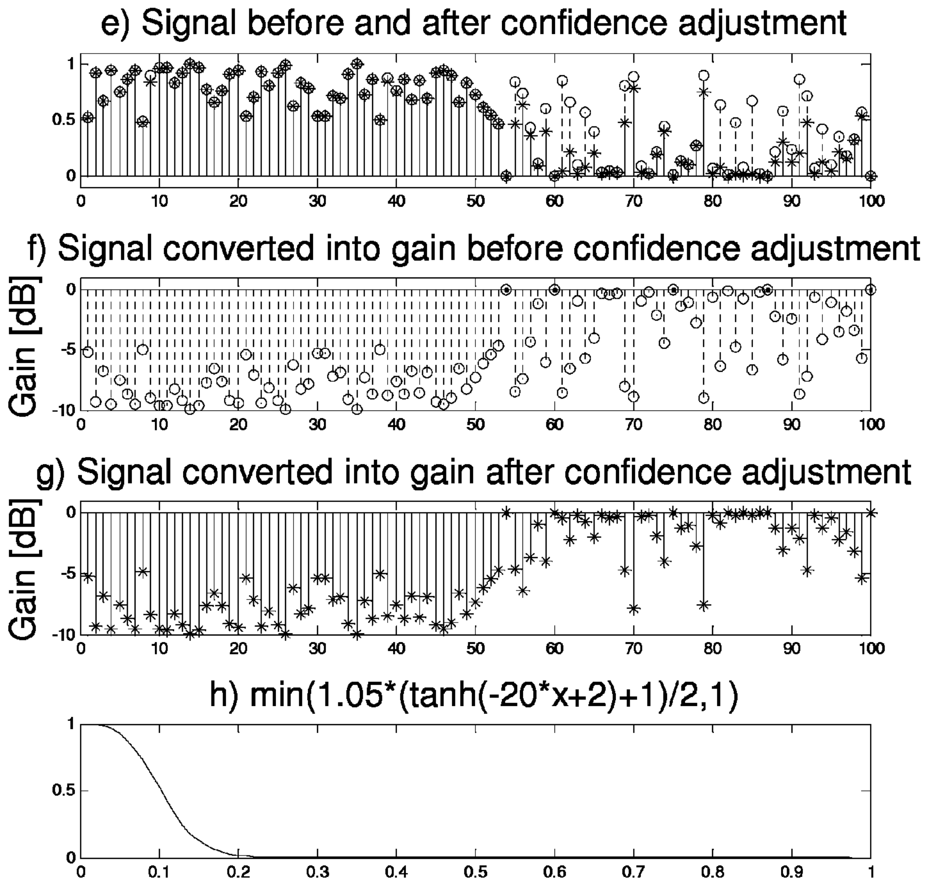

FIG. 7 shows an example of the use of the scheme of the present disclosure with reference to the embodiment of an audio processing device shown in FIGS. 1 and 2. The graphs (a)-(h) illustrate normalized signals having values between 0 and 1 for the same time period of 100 time units (time frames, m=1, 2, . . . , 100). The graphs (a)-(h) are distributed over two pages denoted FIG. 7*a* and FIG. 7*b* where graphs (a)-(d) are shown on FIG. 7*a* and graphs (e)-(h) are shown on FIG. 7*b*. In the following the graphs (a)-(h) are referred to as FIG. 7(*a*)-FIG. 7(*h*). FIG. 7(*a*) illustrates an input signal I($k_0$,m) (e.g. the magnitude vs. time for a particular frequency $k_0$), where the signal values exhibit relatively few changes in magnitude in the first half of the time period and relatively many shifts in the second half of the time period. The graph in FIG. 7(*b*) shows the difference in magnitude between signal values of adjacent time units of FIG. 7(*a*), here abs$^2$ ($|I(k_0,m)-I(k_0,m-1)|^2$) is used (cf. Magnitude in FIG. 1). The graph in FIG. 7(*c*) shows the result of an averaging process working on the signal of FIG. 7(*b*) (cf. Smooth in FIG. 1). The graph in FIG. 7(*d*) shows the result of a conversion of the time averaged magnitude difference in FIG. 7(*c*) to a confidence estimate (here a probability). The function MIN[1.05*(tan h(−20*x+2)+1)/2,1] that has been used in the conversion (cf. IOM in FIG. 1 and function equivalent to FIG. 2) is shown in FIG. 7(*h*). The graph in FIG. 7(*e*) shows the input signal before (circles, FIG. 7(*a*)) and after (asterisk) being multiplied with the confidence estimate of FIG. 7(*d*). The graph in FIG. 7(*f*) shows the input signal (FIG. 7(*a*)) after conversion from a normalized signal to a gain (attenuation) signal in dB, i.e. without the use of the artifact reduction scheme of the present disclosure. The graph in FIG. 7(*g*) shows the adjusted input signal (cf. FIG. 7(*e*), asterisk) after conversion from a normalized signal to a gain (attenuation) signal in dB, i.e. illustrating the effect of the artifact reduction scheme of the present disclosure. The effect of the artifact reduction scheme is clear from a comparison of FIGS. 7(*f*) and 7(*g*) in the second half of the time period, in particular around time units 75-95, where the input signal (FIG. 7(*a*)) fluctuates rapidly with time (and this fluctuation is attenuated in the signal of FIG. 7(*g*) based on the artifact reduction scheme).

Figure 8:
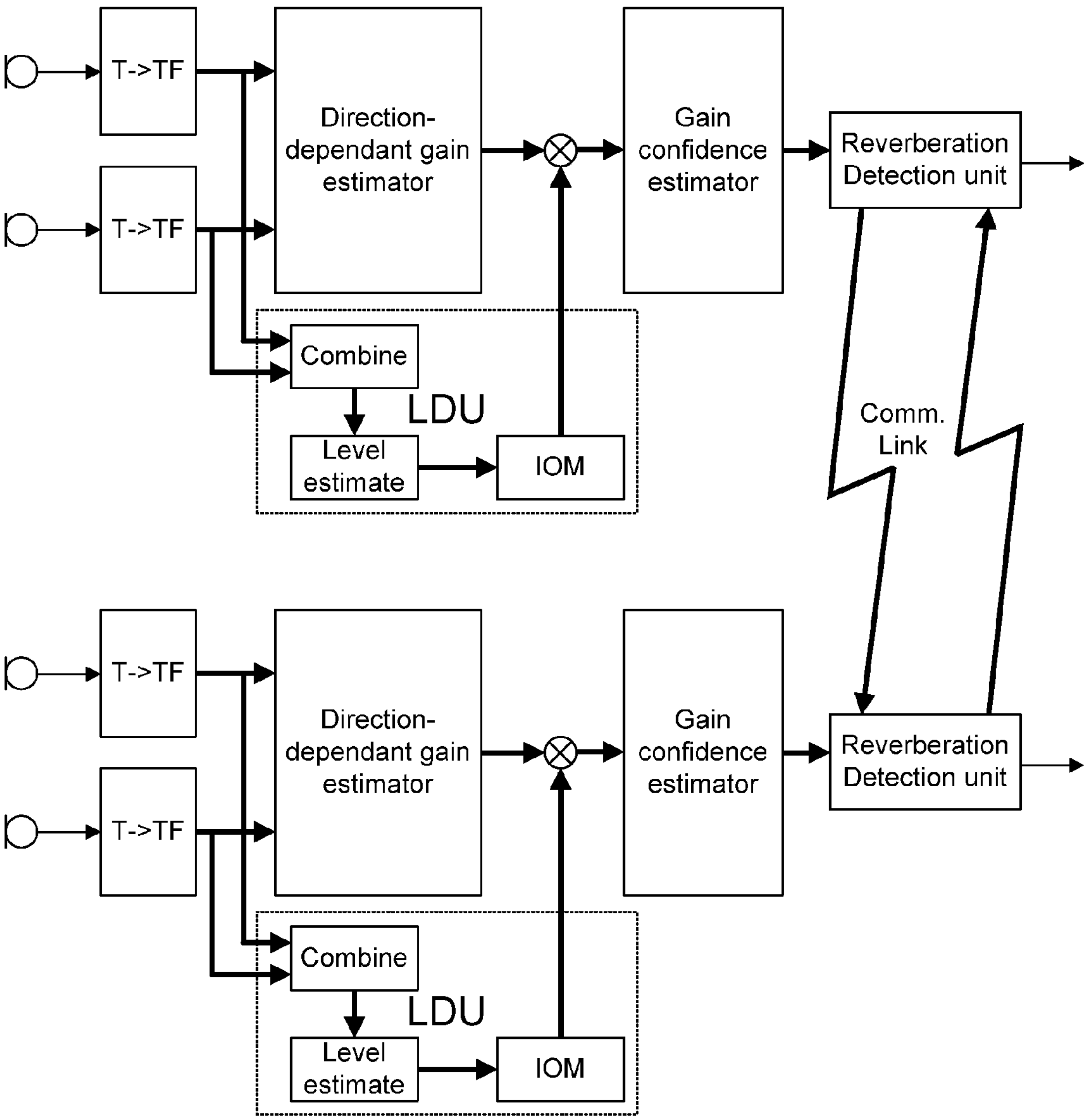
FIG. 8 shows an audio processing system for identifying reverberation.

FIG. 8 shows an audio processing system for identifying reverberation. The audio processing system comprises first and second audio processing devices according to the present disclosure. The first and second audio processing devices each comprise two microphones for converting an input sound to an electric input signal comprising an audio signal. Each of the electric input signal are converted to the (time-) frequency domain in time-frequency conversion units T→TF. The time to time-frequency converted electric input signals from the respective T→TF-units are fed to a unit for applying a processing algorithm, here Direction dependent gain estimator providing a direction dependent processing (e.g. noise reduction) of the input signal, e.g. an processed gain or attenuation or a specific value of the processed input signal in a time-frequency representation (cf. e.g. FIG. 3). The time to time-frequency converted electric input signals from the respective T→TF-units are also fed to a level decision unit LDU. The level decision unit LDU comprises combination unit Combine for combining the two time to time-frequency converted electric input signals to a combined input signal, a level detector Level estimate for estimating the level of the combined input signal and providing a combined input level estimate, and a decision unit IOM for translating the combined input level estimate to an input level weighting factor, forming the output of the level decision unit LDU. The input level weighting factor is relatively low (e.g. equal to zero) when the combined input level is lower than a predefined value (where a fluctuation in the input signal can be due to (fluctuating) noise in the input transducer). In this case the low value of the input level weighting factor ensures that (possibly fluctuating) time-frequency units having a small input signal level are suppressed (by multiplication onto the time-frequency representation of the processed input signal). If, on the other hand, the combined input level is higher than a predefined value, the input level weighting factor is relatively high (e.g. equal to one). A gradual decision map (I/O Map) may likewise be envisioned (cf. e.g. FIG. 2 and the corresponding description, where the horizontal axis should be the estimated input level and the curve should be mirrored around a vertical axis). The input level weighting factor is fed to a combiner unit (here shown as multiplying unit 'x'), where it is combined (here multiplied) with the time-frequency representation of the processed input signal from the processing algorithm (block Direction dependent gain estimator). The resulting improved processed input signal is fed to a Gain confidence estimator (cf. artifact reduction unit discussed previously, e.g. in connection with FIG. 6), where a time averaged measure of the fluctuation of the improved processed input signal (e.g. for each time-frequency unit) is provided, termed the gain confidence signal. The gain confidence signal is fed to a Reverberation Detection unit wherein the gain confidence signal of the current device (and possibly a corresponding gain confidence signal received from another device, cf. below) is analyzed and an estimate of the reverberation present in the input signal in a given time frame or in a number of time frames and/or in a number of frequency bands of one or more time frames is provided. The reverberation estimate is e.g. based on a (possibly weighted) sum of the values of the gain confidence signal in the relevant time-frequency units. A relatively large value of the sum of the values of the gain confidence signal indicating relatively few shifts in the input signal indicating relatively small reverberation and vice versa. A gradual transition from a relatively low to a relatively high probability of reverberation may be implemented in the Reverberation Detection unit (cf. e.g. FIG. 2, and the corresponding description, where the horizontal axis in FIG. 2 should represent the sum of the values of the gain confidence signal).

The first and second audio processing devices thus generate, respectively, first and second confidence estimates (e.g. probabilities), and/or derives first and second estimates of the (probability of) reverberation present in the input signal received by the device in question. Each audio processing device of the system of FIG. 8 comprises a (e.g. wireless) transceiver for establishing a bidirectional link (Comm. Link in FIG. 8) to the other device and is adapted to transmit a confidence estimate (or a measure originating there from) to the other audio processing device. Each audio processing device is adapted to compare the first and second confidence estimates (or measures originating there from, e.g. reverberation probabilities) and to generate a resulting confidence estimate (or a measure originating there from) that is applied to respective estimated algorithm output signals (e.g. to noise reduced output signals) of the first and second devices. In an embodiment, an average (e.g. a weighted average) of the first and second confidence probabilities (or measures originating there from) is generated and used to apply to the respective estimated algorithm output signals (e.g. to noise reduced output signals). If e.g. one of the reverberation probabilities (or confidence estimates) is significantly different from the other, this may be taken to indicate no or small reverberation (because a reverberation effect is assumed to result in a spatially distributed, diffuse signal). If on the other hand both measures are substantially equal, a conclusion of reverberation can be based on the measures. In an embodiment, each audio processing device comprises a wireless transceiver for establishing a bidirectional link (Comm. Link in FIG. 8) to the other device and is adapted to transmit a partial or a full audio signal (e.g. in addition to control signals, including a confidence estimate of an audio processing algorithm or a reverberation probability of an input signal) to the other audio processing device. In an embodiment, first and second audio processing devices each comprise a hearing instrument, the audio processing system thereby comprising a binaural hearing aid system comprising first and second hearing instruments adapted for being worn by a user at or in the respective ears of the user.

The invention is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims.

REFERENCES

U.S. Pat. No. 6,351,731
U.S. Pay. No. 6,088,668
U.S. Pat. No. 7,016,507
U.S. Pat. No. 5,473,701
WO 99/09786 A1
EP 2 088 802 A1
[Haykin] S. Haykin, Adaptive filter theory (Fourth Edition), Prentice Hall, 2001
[Berouti et al.; 1979] M. Berouti, R. Schwartz and J. Makhoul, "Enhancement of speech corrupted by acoustic noise" Proc IEEE ICASSP, 1979, 4, pp. 208-211.
[Cappe; 1994] Olivier Cappe, "Elimination of the Musical Noise Phenomenon with the Ephraim and Malah Noise Suppressor," IEEE Trans. on Speech and Audio Proc., vol. 2, No. 2, April 1994, pp. 345-349.
[Linhard et al.; 1997] Klaus Linhard and Heinz Klemm, "Noise reduction with spectral subtraction and median filtering for suppression of musical tones," Proc. of ESCA-NATO Workshop on Robust Speech Recognition for Unknown Communication Channels, 1997, pp 159-162,
[Ephraim et al.; 1984] Ephraim, Y. & Malah, D. "Speech enhancement using a minimum-mean square error short-time spectral amplitude estimator", IEEE Trans. Acoustics Speech and Signal Processing, 32 (1984), pp. 1109-1121.

The invention claimed is:

1. A method of reducing artifacts in an audio processing algorithm for applying a time and frequency dependent gain to an input signal, the method comprising:

Providing a time frequency representation i(k,m) of an input signal in a number of consecutive time frames, each time frame comprising a number of time-frequency units, each time-frequency unit comprising a complex or real value of the input signal, k, m being frequency and time indices respectively;

Applying the audio processing algorithm to said time frequency representation of said input signal and providing an estimated algorithm output signal;

Determining for at least one frequency of said input signal a difference between a value of the estimated algorithm output signal in a time-frequency unit of a given time frame and that of a preceding time frame;

Determining a measure of the magnitude of said difference;

Providing a time averaged value of the measure of the magnitude difference; and

Providing a confidence estimate based on said time averaged value of the measure of the magnitude difference, said confidence estimate decreasing from a maximum value towards a minimum value for increasing time averaged values of the measure of the magnitude difference.

2. A method according to claim 1 comprising the step of applying said confidence estimate to said estimated algorithm output signal thereby providing an improved algorithm output signal o(k,m).

3. A method according to claim 1 wherein the confidence estimate is used as an input to a processing algorithm.

4. A method according to claim 1 wherein the time averaged magnitude difference is provided as a real number between 0 and 1.

5. A method according to claim 1 wherein the confidence estimate has a first high value PH when the time averaged magnitude difference is below a predetermined first threshold level Δ1 and wherein the confidence estimate has a second low value PL when the time averaged magnitude difference is above a predetermined second threshold level Δ2.

6. A method according to claim 5 wherein the confidence estimate decreases monotonically from the first high value PH to the second low value PL, when the time averaged magnitude difference increases from said predetermined first threshold level Δ1 to said predetermined second threshold level Δ2.

7. A method according to claim 1 wherein the preceding time frame is the immediately previous time frame.

8. A method according to claim 1 wherein the audio processing algorithm is a noise reduction algorithm or a speech enhancement algorithm.

9. A method according to claim 1 wherein the improved algorithm output signal o(k,m) is provided in relative terms.

10. A method according to claim 1 wherein the method is used to detect reverberance in a given acoustical environment.

11. A method according to claim 10, further comprising:

analysing an average of a sum of the measure of the magnitude difference across time and the measure of the magnitude difference across frequency from an output of an audio processing algorithm.

12. A method according to claim 11 wherein the magnitude difference measure is combined with a level detection measure to generate an indicator of reverberation.

13. A data processing system comprising a processor and program code means for causing the processor to perform the steps of the method of claim 1.

14. An audio processing device for applying a time and frequency dependent gain to an input signal, the device comprising:

A T-TF-unit for providing a time frequency representation of an input signal, the time frequency representation comprising a number of consecutive time frames, each time frame comprising a number of time-frequency units, each time-frequency unit comprising a complex or real value of the input audio signal at a particular time and frequency;

An audio processing unit for providing an estimated algorithm output signal based on said time frequency representation of said input signal;

An artifact reduction unit adapted to provide a confidence estimate by

Determining for at least one frequency of said input signal a difference between a value of the estimated algorithm output signal in a time-frequency bin of a given time frame and that of a preceding time frame;

Determining a measure of the magnitude of said difference;

Averaging the measure of the magnitude difference over a predefined time; and

Providing a confidence estimate based on said time averaged value of the measure of the magnitude difference, said confidence estimate decreasing from a maximum value towards a minimum value for increasing time averaged values of the measure of the magnitude difference.

15. An audio processing device according to claim 14 comprising a combination unit for applying said confidence estimate to said estimated algorithm output signal thereby providing an improved estimated algorithm signal.

16. An audio processing device according to claim 14 comprising a digital filter with different attack and release times for averaging said difference over a predefined time.

17. An audio processing device according to claim 14 comprising a level decision unit comprising a level detector for determining or estimating a magnitude level of an input signal and a decision unit for translating the input level estimate to an input level weighting factor.

18. An audio processing system comprising first and second audio processing devices according to claim 14, the first and second audio processing devices generating first and second confidence estimates, respectively, each audio processing device comprising a wireless transceiver for establishing a bidirectional link to the other device and being adapted to transmit its respective confidence estimate or a measure originating there from to the other audio processing device.

19. Use of an audio processing device or an audio processing system according to claim 14.

20. Use according to claim 19 in a public address system, in a listening device or a headset, or in a teleconferencing system.

21. Use according to claim 19 for estimating reverberation.

* * * * *